(12) United States Patent
Ishii et al.

(10) Patent No.: US 7,936,418 B2
(45) Date of Patent: May 3, 2011

(54) WHITE LIGHT-EMITTING DEVICE AND MANUFACTURING METHOD THEREOF, AND BACKLIGHT AND LIQUID CRYSTAL DISPLAY DEVICE USING THE SAME

(75) Inventors: Tsutomu Ishii, Yokohama (JP); Yasuhiro Shirakawa, Yokohama (JP); Hajime Takeuchi, Yokohama (JP); Yasumasa Ooya, Chigasaki (JP); Ryo Sakai, Yokohama (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 489 days.

(21) Appl. No.: 12/088,701

(22) PCT Filed: Sep. 28, 2006

(86) PCT No.: PCT/JP2006/319353
§ 371 (c)(1),
(2), (4) Date: Mar. 31, 2008

(87) PCT Pub. No.: WO2007/037339
PCT Pub. Date: Apr. 5, 2007

(65) Prior Publication Data
US 2009/0154195 A1 Jun. 18, 2009

(30) Foreign Application Priority Data
Sep. 29, 2005 (JP) ................................. 2005-285623

(51) Int. Cl.
*G02F 1/1335* (2006.01)
*F21V 7/04* (2006.01)
*G09F 13/04* (2006.01)

(52) U.S. Cl. ........... 349/61; 349/65; 362/612; 362/97.2; 362/97.3

(58) Field of Classification Search .................... 349/61, 349/65; 362/612, 97.2, 97.3
See application file for complete search history.

(56) References Cited

U.S. PATENT DOCUMENTS
5,442,202 A * 8/1995 Kinoshita et al. ............... 257/94
(Continued)

FOREIGN PATENT DOCUMENTS
JP  10 97200     4/1998
JP  2000 73052   3/2000
(Continued)

OTHER PUBLICATIONS

Tadatomo, K. et al., "Development of White LED Fabricated by RGB Phosphor and Near Ultra-Violet LED", Mitsubishi Cable Industries, Ltd. Times, vol. 99, pp. 35 to 41, 2002.

*Primary Examiner* — Mike Qi
(74) *Attorney, Agent, or Firm* — Oblon, Spivak, McClelland, Maier & Neustadt, L.L.P.

(57) ABSTRACT

A white light-emitting device 1 includes a semiconductor light-emitting element 2 emitting ultraviolet light or violet light, and a light-emitting unit 10 which includes three or more kinds of visible light-emitting phosphors 9 and emits white light when excited by the light from the semiconductor light-emitting element 2. The emission spectrum of the light-emitting unit 10 has peaks in a blue region of not less than 440 nm nor more than 460 nm, a green region of not less than 510 nm nor more than 530 nm, and a red region of not less than 620 nm nor more than 640 nm, and the three or more kinds of visible light-emitting phosphors 9 are bound together with a binder in advance.

15 Claims, 4 Drawing Sheets

U.S. PATENT DOCUMENTS

| | | | |
|---|---|---|---|
| 5,998,925 A * | 12/1999 | Shimizu et al. | 313/503 |
| 6,084,250 A * | 7/2000 | Justel et al. | 257/89 |
| 7,514,020 B2 * | 4/2009 | Zeng et al. | 252/301.4 F |
| 7,639,318 B2 * | 12/2009 | Takeuchi et al. | 349/61 |
| 7,649,310 B2 * | 1/2010 | Ishii et al. | 313/503 |
| 2008/0106186 A1 * | 5/2008 | Ishii et al. | 313/503 |
| 2010/0060822 A1 * | 3/2010 | Sun | 349/71 |

FOREIGN PATENT DOCUMENTS

| | | |
|---|---|---|
| JP | 2001 172623 | 6/2001 |
| JP | 2003 160785 | 6/2003 |
| JP | 2004 235546 | 8/2004 |
| JP | 2004 331934 | 11/2004 |
| JP | 2005 194340 | 7/2005 |

* cited by examiner

WHITE LIGHT-EMITTING DEVICE AND MANUFACTURING METHOD THEREOF, AND BACKLIGHT AND LIQUID CRYSTAL DISPLAY DEVICE USING THE SAME

BACKGROUND OF THE INVENTION

1. Field of the Invention

The present invention relates to a white light-emitting device and a manufacturing method thereof, and a backlight and a liquid crystal display device using the same.

2. Description of the Related Art

A light-emitting diode (LED) converts electric energy to light such as ultraviolet light or visible light to emit the light. To utilize visible light, an LED having a light-emitting chip formed of a light-emitting material such as GaP, GaAsP, GaAlAs, GaN, InGaAlP or the like sealed in a transparent resin is widely used. Further, a display-type LED is also used in which a light-emitting material is fixed to an upper surface of a printed circuit or a metal lead and sealed in a resin case shaped in a figure or character.

Further, various kinds of phosphor powders are contained in a front surface or a forward resin of the light-emitting chip to adjust the color of emitting-light in the LED. In other words, the LED can reproduce emission within a visible light region according to application ranging from blue to red. The LED is a semiconductor element, and therefore has advantages such as a long life and high reliability, and its replacement works are reduced when it is used as a light source. Therefore, LEDs are widely used components of various display devices such as mobile communication equipment, personal computer (PC) peripheral equipment, OA equipment, household electric equipment, audio equipment, various switches, backlight-type display plate and so on.

Recently, the users of display devices have improved sense of color and have demanded a function capable of reproducing delicate shades with a higher precision a uniform LED appearance also in various kinds of display devices. In particular, LEDs emitting white light are significantly spreading in backlight of cellular phone and on-vehicle lamp and are expected to greatly grow as an alternative to fluorescent lamp in the future. Hence, various improvements are explored for high color rendering property of white light and uniform appearance.

As LEDs emitting white light which are currently in actual or experimental use, there are a type in which a diode chip emitting blue light, a yellow emitting phosphor (YAG or the like), and optionally a red emitting phosphor are combined (hereinafter, referred to as a type A), and a type in which a diode chip emitting ultraviolet light or violet light, and blue, green, and red phosphors are combined (hereinater, referred to as a type B). At the present, the former type A is widely used because it has a higher brightness than the type B, but the type A may be yellowish in appearance depending on the direction in which it is viewed, or cause yellow or blue shading when the light is projected on a white surface. Type A may be called a pseudo white. The white light-emitting LED of the type A has an average color rendering index, which indicates the quality of white light, remaining within a range of 70 to 75.

On the other hand, the latter type B is inferior in brightness to the type A but has less unevenness in emitted light and projected light and is therefore expected as a most likely candidate for illumination and backlight in the future and is getting expanded into various kinds of applications and developed. As an improvement in this direction, for example, Non-Patent Document 1 reports a white light-emitting LED made by combining a diode chip emitting ultraviolet light, a Eu-activated halo-phosphate phosphor or a Eu-activated aluminate phosphor as a blue phosphor, a Cu and Al-activated zinc sulfide phosphor or a Eu and Mn-activated aluminate phosphor as a green light-emitting phosphor, and a Eu-activated yttrium oxysulfide as a red light-emitting phosphor.

Further, Patent Document 1 discloses a white light-emitting LED made by combining a diode chip emitting ultraviolet light, a Eu-activated halo-phosphate phosphor or a Eu-activated aluminate phosphor as a blue phosphor, a Eu and Mn-activated aluminate phosphor as a green light-emitting phosphor, and a Eu-activated lanthanum oxysulfide phosphor as a red light-emitting phosphor.

Any of the above-described white light-emitting LEDs has a high color rendering property that is the feature of the type B but is still insufficient in brightness and needs to be improved. To achieve a high color rendering property and high brightness in the white light-emitting LED of the type B, it is necessary that the spectrum of white light includes well balanced lights near 450 nm, near 560 nm and near 620 nm where human beings have peaks of the sense of color and has well-balanced efficiencies of blue, green and red phosphors. Further, it has been found that variation occurs in emission chromaticity due to use of a plurality of phosphors of different emission colors in combination.

In the process of trying in various ways to put the white light-emitting LED of the type B into practical use, it has been found that there is a difference in developing approach between illumination application and backlight application. It is important that the white light-emitting LED for illumination application has a high brightness and a high average color rendering index (Ra) which defines the quality of the white light but, in contrast, the white light-emitting LED for backlight application needs to have a high brightness and a wide color reproduction region. The high brightness is a feature required both in these applications, but the high average color rendering index and the wide color reproduction region are required depending on a device which are not always compatible.

On the other hand, it has been found that use of a plurality of phosphors emitting different colors in combination or the like causes variation in emission chromaticity of the white light-emitting LED. The variation in chromaticity reduces the manufacturing yield of the white light-emitting LEDs and thus reduces the color reproducing performance of a backlight using the white light-emitting LED. Hence, it is strongly demanded to suppress the variation in chromaticity. In particular, a white light-emitting LED applied to the backlight in the liquid crystal display device which has significantly grown has no environmental problem accompanied with use of mercury which has caused a problem in a conventional cold cathode fluorescent lamp, and has a possibility of increasing the color reproduction region, and therefore its technical development is highly expected.

Reference 1: JP-A 2000-73052 (KOKAI)

Non-Patent Reference 1: Mitsubishi Cable Industries, Ltd. Times (Vol. 99 July, 2002)

BRIEF SUMMARY OF THE INVENTION

An object of the present invention is to provide a white light-emitting device having high brightness and excellent color reproducibility as well as reduced variation in emission chromaticity and a manufacturing method thereof, and a backlight and a liquid crystal display device using such a white light-emitting device.

A white light-emitting device according to an aspect of the present invention includes a semiconductor light-emitting element emitting ultraviolet light or violet light; and a light-emitting unit, which is excited by the light from the semiconductor light-emitting element to emit white light, including three or more kinds of visible light-emitting phosphors, wherein emission spectrum of the light-emitting unit has peaks in a blue region of not less than 440 nm nor more than 460 nm, a green region of not less than 510 nm nor more than 530 nm, and a red region of not less than 620 nm nor more than 640 nm, and the three or more kinds of visible light-emitting phosphors are bound together with a binder in advance.

A method of manufacturing a white light-emitting device according to another aspect of the present invention includes preparing three or more kinds of visible light-emitting phosphors adjusted to have emission spectrum of white light emission exhibiting peaks in a blue region of not less than 440 nm nor more than 460 nm, a green region of not less than 510 nm nor more than 530 nm, and a red region of not less than 620 nm nor more than 640 nm; binding the three or more kinds of visible light-emitting phosphors with a binder; and forming a light-emitting unit including the bound three or more kinds of visible light-emitting phosphors, in a light-emitting direction of a semiconductor light-emitting element emitting ultraviolet light or violet light.

A backlight according to an aspect of the present invention includes a substrate; and a white light-emitting device according to the aspect of the present invention mounted on the substrate. In the backlight according to the aspect of the present invention, white light-emitting devices are arranged in line or in matrix on the substrate. A liquid crystal display device according to an aspect of the present invention includes the backlight according to the aspect of the present invention; and a liquid crystal display unit disposed on a light-emitting surface side of the backlight.

EXPLANATION OF NUMERALS

1 . . . white LED lamp, 2 . . . LED chip, 3A, 3B . . . lead terminal, 4 . . . wiring substrate, 5 . . . bonding wire, 6 . . . frame, 7 . . . reflection layer, 8 . . . resin, 9 . . . phosphor, 10 . . . light-emitting unit, 20 . . . backlight, 20A . . . side view type backlight, 20B . . . direct type backlight, 21 . . . wiring layer, 22 . . . substrate, 30, 40 . . . liquid crystal display device, 31 . . . light source, 32 . . . optical waveguide, 33 . . . reflection layer, 34 . . . color liquid crystal display unit, 35 . . . optical sheet

DETAILED DESCRIPTION OF THE INVENTION

Figure 1:
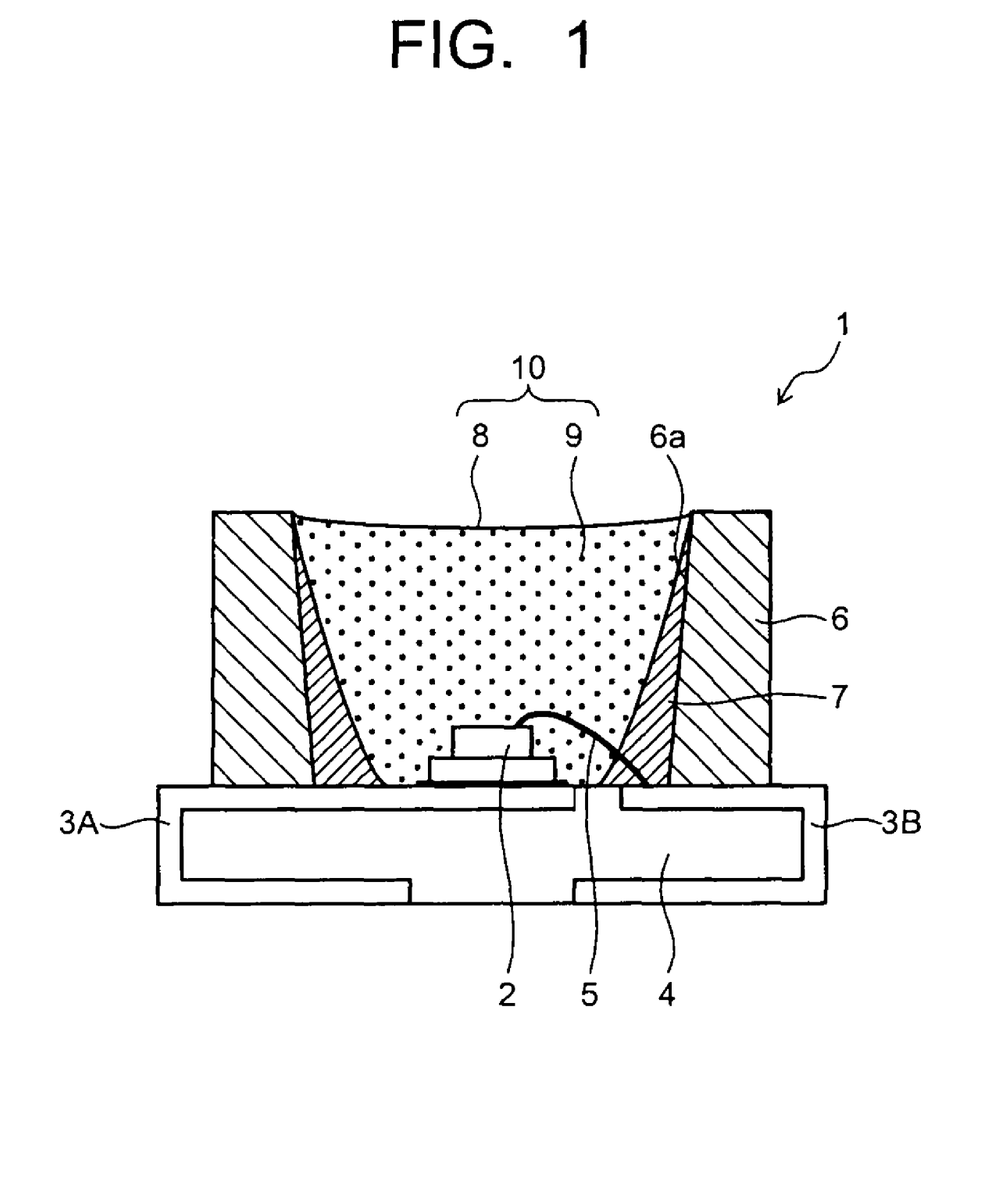
FIG. 1 is a cross-sectional view showing a configuration of a white LED lamp according to an embodiment of the present invention.

Hereinafter, embodiments for carrying out the present invention will be described. FIG. 1 is a cross-sectional view showing a configuration of an embodiment in which a white light-emitting device of the present invention is applied to an LED lamp emitting white light. A white LED lamp 1 shown in that drawing has an LED chip 2 emitting ultraviolet or violet light as an excitation source (light source). Note that the light source of the white light-emitting device is not limited to the LED chip 2, but may be a laser diode (semiconductor laser). As the excitation source of the white light-emitting device, for example, a semiconductor light-emitting element such as a light-emitting diode or laser diode, which has a peak value of an emission wavelength of not less than 370 nm nor more than 410 nm, can be used.

As the LED chip 2 as the excitation source, various kinds, for example, InGaN-based, GaN-based and AlGaN-based ultraviolet light-emitting diode and violet light-emitting diode are used. The peak value of the emission wavelength of the LED chip 2 is preferably not less than 370 nm nor more than 410 nm. Combining such an LED chip 2 with later-described phosphors for use enables realization of the white LED lamp 1 having higher brightness and more excellent color reproducibility. Note that the ultraviolet light-emitting diode or the violet light-emitting diode as the excitation source is expressed here as the LED chip 2, and the light-emitting device for finally obtaining white light emission is expressed as the white LED lamp 1.

The LED chip 2 is mounted on a wiring substrate 4 having a pair of lead terminals 3A and 3B. A lower electrode of the LED chip 2 is electrically and mechanically connected to the lead terminal 3A. An upper electrode of the LED chip 2 is electrically connected to the lead terminal 3B via a bonding wire 5. On the wiring substrate 4, a cylindrical frame 6 is provided, and a reflection layer 7 is formed on its inner wall 6a. In the frame 6, a transparent resin 8 is filled as a resin layer, and the LED chip 2 is embedded in the transparent resin 8.

The transparent resin 8 having the LED chip 2 embedded therein contains phosphors 9 for obtaining white light. The phosphors 9 dispersed in the transparent resin 8 are excited by the ultraviolet or violet light emitted from the LED chip 2 to emit white light. In other words, the transparent resin 8 having the phosphors 9 dispersed therein functions as a light-emitting unit 10 emitting white light. The light-emitting unit 10 is placed in a light-emitting direction of the LED chip 2. As the transparent resin 8, for example, a silicone resin, an epoxy resin, or the like is used. Note that the substrate 4, the frame 6 and so on take any configurations.

As the phosphors 9 for obtaining white light, three or more kinds of visible light-emitting phosphors are used so that the emission spectrum of the light-emitting unit 10 has peaks in a blue region of not less than 440 nm nor more than 460 nm, a green region of not less than 510 nm nor more than 530 nm, and a red region of not less than 620 nm nor more than 640 nm. Specifically, as the three or more kinds of visible light-emitting phosphors 9, a blue phosphor having a peak wavelength of not less than 440 nm nor more than 460 nm, a green phosphor having a peak wavelength of not less than 510 nm nor more than 530 nm, and a red phosphor having a peak wavelength of not less than 620 nm nor more than 640 nm are used. Two or more kinds of same color phosphors may be used. The three or more kinds of visible light-emitting phosphors 9 bound together with a binder in advance are dispersed in the transparent resin 8.

An electric energy applied to the white LED lamp 1 is converted to ultraviolet light or violet light by the LED chip 2. The light emitted from the LED chip 2 is converted to light with a longer wavelength by the three or more kinds of visible light-emitting phosphors 9 dispersed in the transparent resin 8. Lights emitted from the three or more kinds of visible light-emitting phosphors 9 are mixed in color and emitted, whereby white light in total is emitted from the white LED lamp 1. In other words, the white LED lamp 1 emits white light having emission spectrum exhibiting peaks in a blue region of not less than 440 nm nor more than 460 nm, a green region of not less than 510 nm nor more than 530 nm, and a red region of not less than 620 nm nor more than 640 nm.

Figure 2:
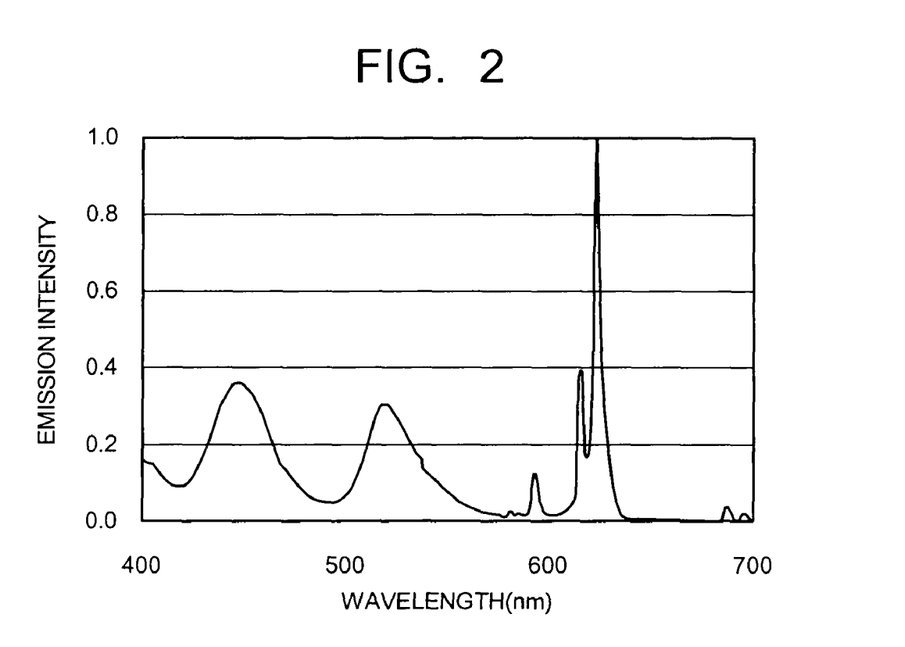
FIG. 2 is a chart showing an example of emission spectrum of the white LED lamp according to the embodiment of the present invention.

An example of emission spectrum of the white LED lamp 1 is shown in FIG. 2. The emission spectrum shown in FIG. 2 is excited by the ultraviolet light-emitting diode 2 having a peak value of the emission wavelength of 400 nm at a current value of 20 mA, and converting the light to white light having a (x, y) chromaticity value of (0.253, 0.238) by the three or more kinds of visible light-emitting phosphors 9. The emission spectrum has peaks 447 nm (blue region), 518 nm (green region), and 623 nm (red region), and a half width of each emission peaks of 50 nm or less.

Figure 3:
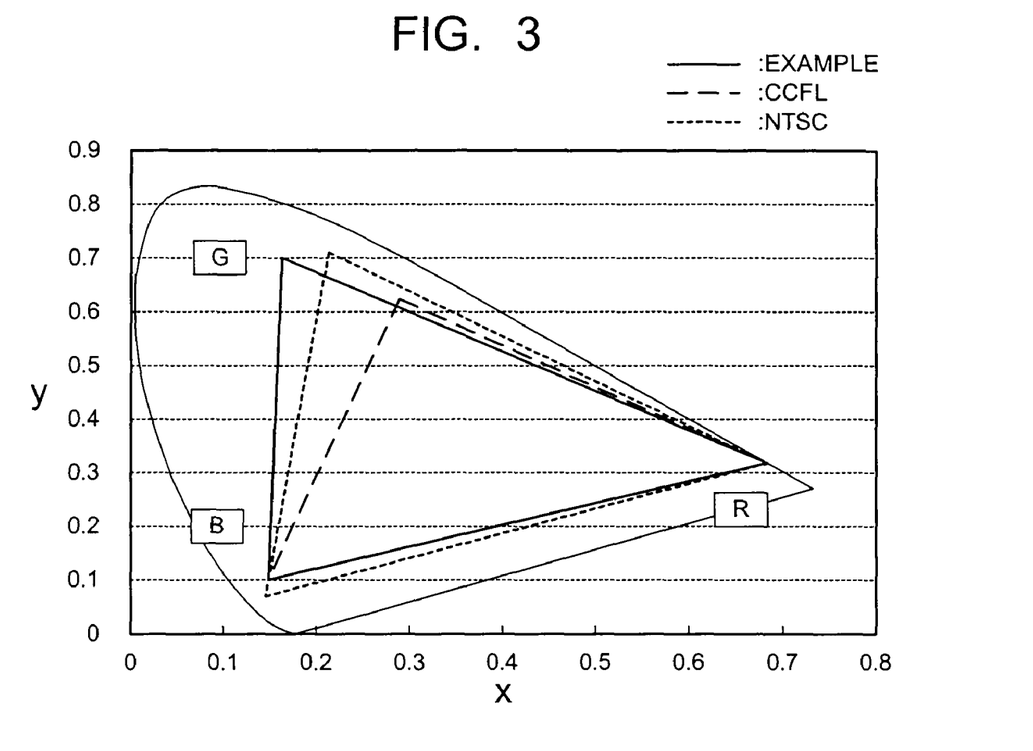
FIG. 3 is a plot showing comparison between color reproduction regions of the white LED lamp according to the embodiment of the present invention and an existing cold cathode fluorescent lamp, when used as a backlight of a liquid crystal display.

FIG. 3 shows emission colors of the emission of the white LED lamp 1 of this embodiment after passed through blue, green and red color filters which are commonly used in a liquid crystal display, plotted in a CIE chromaticity diagram. A triangle obtained by connecting blue, green and red emission points in the CIE chromaticity diagram means that the liquid crystal display can express the light with a chromaticity within the triangle. The liquid crystal display having a lager area of the triangle can express lights with more chromaticities, and will have a larger color reproduction range (better color reproducibility).

FIG. 3 also shows the color reproduction range of a conventional liquid crystal display using a cold cathode fluorescent lamp. It is found that the liquid crystal display using the white LED lamp 1 of this embodiment as a backlight is superior in color reproducibility to the conventional liquid crystal display using a cold cathode fluorescent lamp. FIG. 3 also shows National Television Standards Committee (NTSC) showing an ideal color reproduction range. The size of the color reproduction range is shown by a relative value when the area of the triangle of NTSC is regarded as 100. The color reproduction range of the liquid crystal display using the white LED lamp 1 of this embodiment is 98, whereas that of the liquid crystal display using the cold cathode fluorescent lamp is 65.

Figure 4:
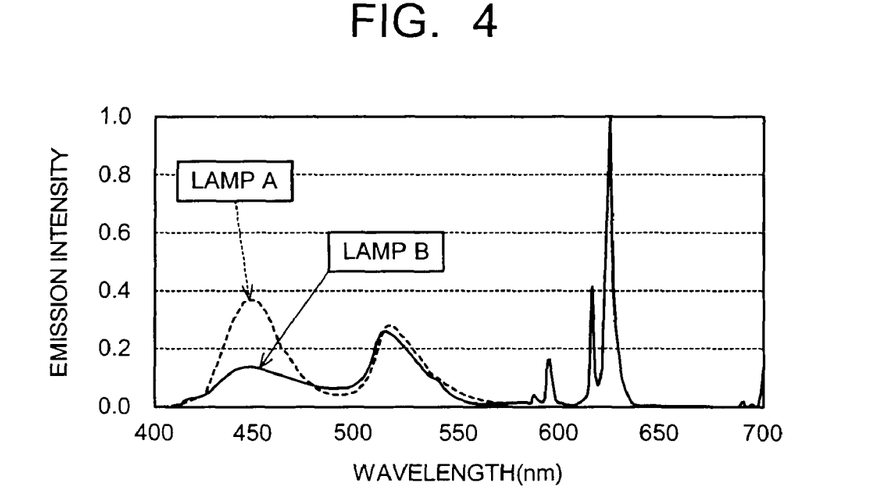
FIG. 4 is a chart showing comparison between emission spectrum of the white LED lamp according to the embodiment of the present invention and that when its half width is changed.
Figure 5:
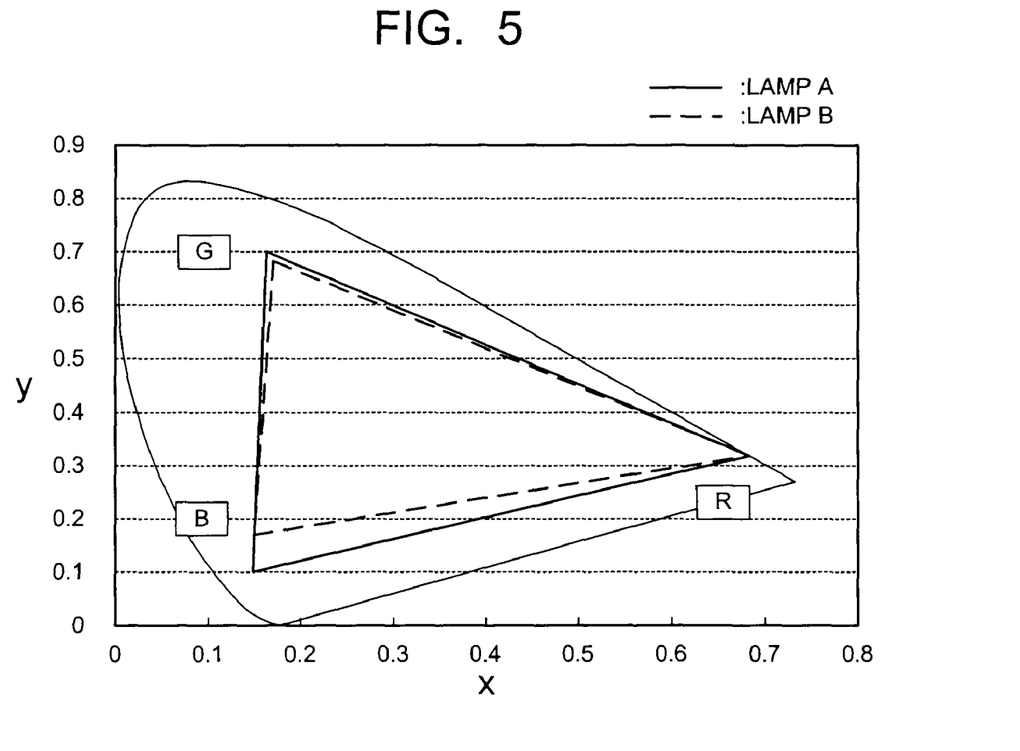
FIG. 5 is a plot showing color reproduction regions of the white LED lamps in FIG. 4 when they are used as backlights of a liquid crystal displays.

The half width of each emission peaks in the blue region, the green region and the red region is preferably 50 nm or less in the emission spectrum of the white LED lamp 1. FIG. 4 shows results of comparison between emission spectra of a lamp A having a half width of each emission peaks in the blue region, the green region and the red region of 50 nm or less and a lamp B having a half width of some of the emission peaks exceeding 50 nm in the white LED lamp of this embodiment. Further, FIG. 5 shows color reproduction ranges of the liquid crystal displays using the lamp A and the lamp B. The color reproduction range of the liquid crystal display using the lamp A has an NTSC value of 98, whereas one using the lamp B has an NTSC value of 87.

The color reproduction range of the lamp B is better than that of the cold cathode fluorescent lamp, but is worse than the color reproduction range of the lamp A. The reason is believed that though the emission spectrum of the lamp B has peaks of 447 nm (blue region), 518 nm (green region), and 623 nm (red region), the half width of the blue peak is as large as 60 nm so that the purity of the blue component is low. Though the white LED lamp 1 preferably allows the color reproduction range of the liquid crystal display using it to have an NTSC value of 90 or more, the white LED lamp 1 allowing an NTSC value of 80 or more can be practically used.

Though the half width of each emission peaks in the emission spectrum of the white LED lamp 1 is desirably 50 nm or less, the white LED lamp 1 having a maximum value of half width of 80 nm or less is enough for practical use. Especially if the half width of one kind out of the blue component, the green component, and the red component is 80 nm or less and the other two kinds are 50 nm or less, the color reproduction range can be made to have an NTSC value of 80 or more. The half width of each emission peaks is preferably 80 nm or less, more preferably 50 nm or less.

As described above, the phosphors 9 (three or more kinds of visible light-emitting phosphors) having peaks in a blue region of not less than 440 nm nor more than 460 nm, a green region of not less than 510 nm nor more than 530 nm, and a red region of not less than 620 nm nor more than 640 nm, and having a property (emission spectrum) that the half width of each emission peaks is 80 nm or less or even 50 nm or less are used to constitute the light-emitting unit 10, thereby enabling realization of the white LED lamp 1 having high brightness and excellent color reproducibility.

Next, three or more kinds of visible light-emitting phosphors 9 will be described in detail. The compositions of the phosphors are not especially limited as long as they have the above-described properties, but it is preferable to use the following phosphors. The blue light-emitting phosphors include a europium (Eu)-activated halo-phosphate phosphor having a composition which is represented by the general formula:

$(Sr_{1-x-y}Ba_xCa_yEu_z)_{10}(PO_4)_6Cl_2$ (where, x, y and z are numbers satisfying $x<0.2$, $y<0.1$, $0.005<z<0.1$). The x value and the y value in General Formula 1 should include zero.

The green light-emitting phosphors include a europium (Eu) and manganese (Mn)-activated aluminate phosphor having a composition which is represented by the general formula:

$(Ba_{1-x-y-z}Sr_xCa_yEu_z)(Mg_{1-u}Mn_u)Al_{10}O_{17}$ (where, x, y and z are numbers satisfying $x<0.5$, $y<0.1$, $0.15<z<0.4$, $0.3<u<0.6$). The x value and the y value in General Formula 2 should include zero.

The red light-emitting phosphors include a europium (Eu)-activated lanthanum oxysulfide phosphor having a composition which is represented by the general formula:

$(La_{1-x-y}Eu_xM_y)_2O_2S$ (where, M shows at least one kind of element selected from Sb and Sn, and x and y are numbers satisfying $0.01<x<0.15$, $y<0.03$). The y value in General Formula 3 should include zero.

The average particle size of each phosphors is preferably 7 μm or more. Further, the average particle size after the phosphors are bound together with a binder is also preferably 7 μm or more. The emission brightness of the white LED lamp 1 tends to increase with the particle size in a range of an average particle size of less than 7 μm and saturate in a range of 7 μm or more irrespective of whether the phosphors are separate or bound together. Accordingly, the three or more kinds of visible light-emitting phosphors 9 forming the light-emitting unit 10 have both an average primary particle size before bonding and an average secondary particle size after bonding of 7 μm or more. The value measured by a light scattering method is shown as the average particle size of the phosphors.

The upper limit of the average particle size of the phosphors is not especially limited but appropriately set according to the structure of the white LED lamp 1. However, it is preferable that the average particle size of the three or more kinds of visible light-emitting phosphors 9 is 90 μm or less because the phosphors are difficult to uniformly mix together if the average particle size is too large. The average particle size of the phosphors is more preferably not less than 10 μm nor more than 80 μm. The mixture ratio of the phosphors is arbitrarily set according to the target chromaticity. To obtain white light by the light-emitting unit 10, the mixture ratio is preferably set to 15 mass % to 25 mass % of the blue phosphor, 15 mass % to 25 mass % of the green phosphor, and the balance of the red phosphor (the total of the blue phosphor, the green phosphor, and the red phosphor is 100 mass %).

The three or more kinds of visible light-emitting phosphors 9 which are bound together with a binder in advance are dispersed in the resin 8. Specifically, the three or more kinds of visible light-emitting phosphors 9 containing the blue phosphor, the green phosphor, and the red phosphor are integrated with a non-organic or organic binder. Such bound phosphors are mixed with the resin and then applied on the LED chip 2. In the white LED lamp 1 shown in FIG. 1, a slurry made by mixing the bound phosphors and the resin is filled in the frame 6 in which the LED chip 2 is placed. Then, the resin 8 is, for example, thermally hardened to produce the white LED lamp 1.

The use of the three or more kinds of visible light-emitting phosphors 9 bound in advance with a binder can reduce variations in chromaticity of the white LED lamp 1. When, for example, the percentage of the red phosphor is larger than those of the blue and green phosphors out of the blue, green and red phosphors forming the white LED lamp 1, only the red phosphor settles down earlier before the hardening treatment of the resin only by mixing these three phosphors. The non-uniformity of the dispersion of phosphors due to the difference in settling speed is believed to cause variations in emission chromaticity. Hence, the blue, green and red phosphors are integrated with a binder in advance and then dispersed in the resin 8, thereby enabling a uniform dispersion state of the phosphors in the resin 8.

The phosphors made by binding blue, green and red phosphors in advance can be obtained, for example, in the following manner. First of all, blue, green and red phosphors are put into water to make a suspension. While this suspension is being stirred, micronized alkaline earth borate or the like is added as a non-organic binder and stirred in this state for a fixed time. The non-organic binder is preferably added at a ratio of 0.01 mass % to 0.3 mass % to the total amount of the blue, green and red phosphors. Thereafter, the stirring is stopped to settle the phosphors, and the phosphors are subjected to filtering, drying, and baking at a temperature of 300° C. or higher for several hours, and to processing such as screening, whereby the bound phosphors made of three or more kinds of bound phosphors can be obtained.

Further, the blue, green, and red phosphors may be integrated with an organic binder such as an acrylic resin or the like. More specifically, the organic binder such as an acrylic resin or the like can be added at a ratio of 0.01 mass % to 0.3 mass % to the total amount of the phosphors, and the phosphors are subjected to filtering, drying, and then processing such as screening, whereby the bound phosphors can be obtained. The binder may be either non-organic or organic.

The white LED lamp 1 of this embodiment is excellent in color reproducibility keeping high brightness and also has reduced variation in emission chromaticity. Accordingly, the white LED lamp 1 is effective as a backlight of a liquid crystal display device. In addition, the liquid crystal display device using the white LED lamp 1 as a backlight has high brightness and excellent color reproducibility as well as reduced variation in emission chromaticity. A high quality liquid crystal display device can be provided.

The white LED lamp 1 has less variation in emission chromaticity can realize a surface light source having a uniform white color also in a case in which a plurality of white LED lamps 1 are employed to constitute the backlight. Therefore, the property of the liquid crystal display device using such a backlight can be improved. The backlight using the white LED lamp 1 is applicable both to a side view type and a direct type.

Figure 6:
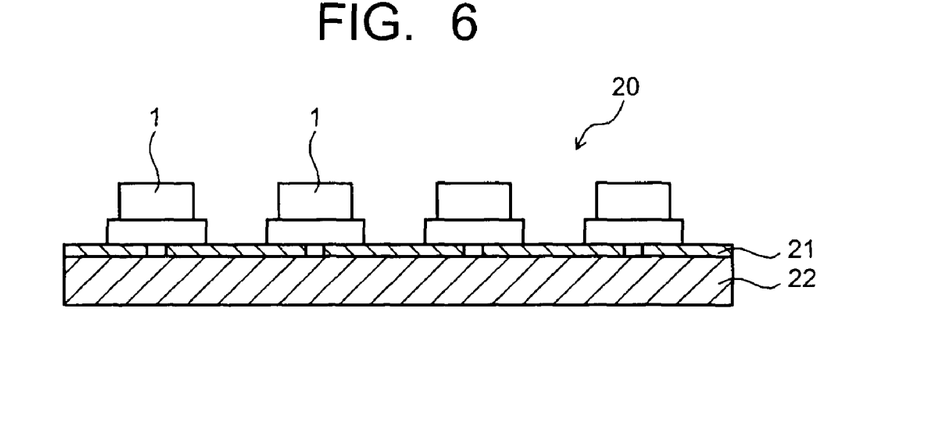
FIG. 6 is a view showing a configuration of a backlight according to an embodiment of the present invention.

FIG. 6 is a view showing a configuration of a backlight according to an embodiment of the present invention. A backlight 20 shown in the drawing has a plurality of white LED lamps 1 arranged inline or in matrix. These white LED lamps 1 are mounted on a substrate 22 having a wiring layer 21, and lead terminals of the white LED lamps 1 are electrically connected to the wiring layer 21. The plurality of white LED lamps 1 are serially connected in sequence.

Figure 7:
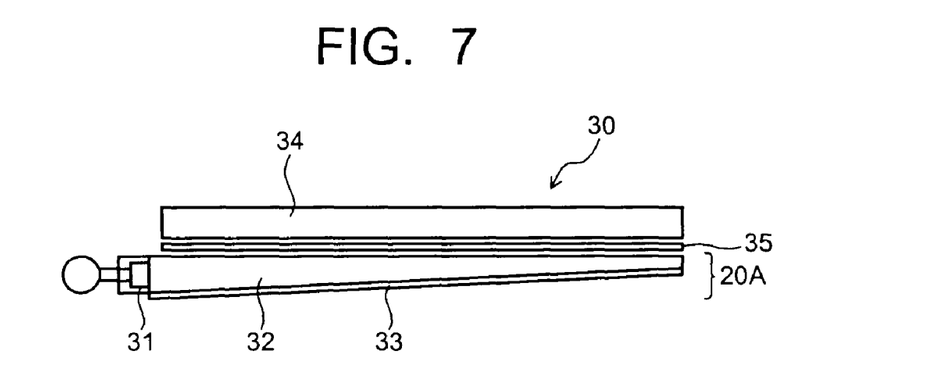
FIG. 7 is a view showing a configuration of a liquid crystal display device according to an embodiment of the present invention.
Figure 8:
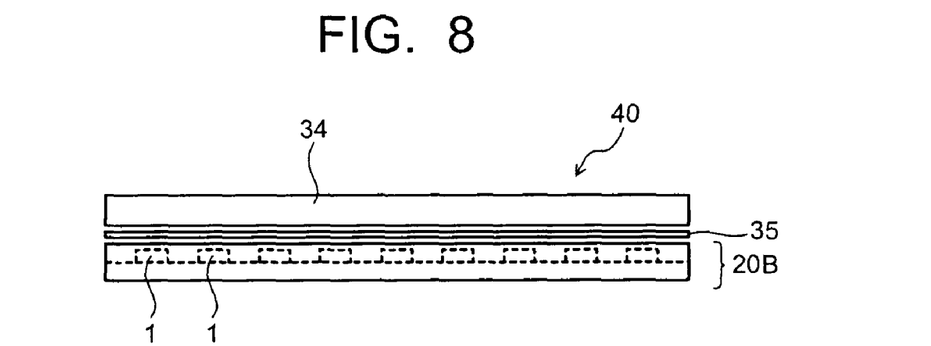
FIG. 8 is a view showing a configuration of a liquid crystal display device according to another embodiment of the present invention.

The backlight 20 is applied to, for example, liquid crystal display devices 30 and 40 as shown in FIG. 7 and FIG. 8. The liquid crystal display devices 30 and 40 shown in these drawings show embodiments of the liquid crystal display device of the present invention. FIG. 7 shows the liquid crystal display device 30 to which a side view type backlight 20A is applied. The side view type backlight 20A has a light source 31 using the white LED lamp 1 and an optical waveguide 32. One end surface of the optical waveguide 32 is an optical incident part, and the light source 31 is disposed on this end surface.

The optical waveguide 32 is tapered from the one end surface as the light incident part toward the other end surface, and a reflection layer 33 is provided on a lower surface side of a tapered portion. Light emitted from the light source 31 repeats refraction and reflection in the optical waveguide 32 to be applied from an upper surface of the optical waveguide 32 in its normal direction. A transmissive or transreflective color liquid crystal display unit 34 is disposed on a light-emitting surface side of the side view type backlight 20A, and these components constitute the liquid crystal display device 30. Between the side view type backlight 20A and the color liquid crystal display unit 34, an optical sheet 35 such as a diffusion sheet or a reflection sheet may be disposed.

FIG. 8 shows the liquid crystal display device 40 to which a direct type backlight 20B is applied. The direct type backlight 20B has a plurality of white LED lamps 1 arranged in matrix according to the shape and area of the transmissive or transreflective color liquid crystal display unit 34. The color liquid crystal display unit 34 is directly disposed in an emission direction of the plurality of white LED lamps 1 constituting the backlight 20B. The direct type backlight 20B and the color liquid display unit 34, and if necessary, the optical sheet 35 disposed therebetween constitute the liquid crystal display device 40.

Next, concrete examples of the present invention and evaluation results thereof will be described. The structure shown in FIG. 1 was employed for the evaluation of the white LED lamp 1. The light-emitting diode having a shape of 300 μm square was cause to emit light at a current value of 60 mA, and the light was passed through blue, green and red color filters which are commonly used in liquid crystal displays. The resulting light was led to an integrating sphere so that the emission colors of blue, green and red were evaluated to thereby evaluate the color reproduction range (color reproducibility) when a display is fabricated.

The color reproducibility is indicated by the area ratio with respect to NTSC as has been described above. The brightness of the white LED lamp was evaluated without the light being passed through the filters. The color reproducibility was evaluated using CAS 140 COMPACT ARRAY SPECTROMETER manufactured by Instrument Systems Inc. The brightness of the white LED lamp 1 was evaluated using MCPD device manufactured by Otsuka Electrics Co., Ltd.

[Method of Fabricating LED Lamp]

The three or more kinds of phosphors were prepared so that the chromaticity of the LED lamp was x=0.250 to 0.255 and y=0.235 to 0.240, and then bound with a binder in advance. The bound phosphors were mixed, at a percentage of 30 mass % or 40 mass %, with a silicone resin at to make a slurry. A portion of the resulting slurry was extracted and dropped onto the LED chip 2 disposed as shown in FIG. 1 and then thermally processed at a temperature of 100° C. to 150° C., whereby the silicone resin was hardened to fabricate the white LED lamp. Note that in the following examples and comparative examples, a light-emitting diode (LED chip) having a peak value of the emission wavelength of 399 nm was used.

EXAMPLE 1

A Eu-activated alkaline earth chlorophosphate $((Sr_{0.99}Eu_{0.01})_{10}(PO_4)_6.Cl_2)$ phosphor was prepared as the blue phosphor, a Eu and Mn-activated aluminate $((Ba_{0.726}Eu_{0.274})(Mg_{0.55}Mn_{0.45})Al_{10}O_{17})$ phosphor was prepared as the green phosphor, and a Eu-activated lanthanum oxysulfide $((La_{0.883}Sb_{0.002}Eu_{0.115})_2O_2S)$ phosphor was prepared as the red phosphor. These phosphors were bound at a ratio of 20.1%, 19.5% and 60.4% and mixed, at a concentration of 40 mass %, with a silicone resin to make a slurry. This slurry was dropped onto the light-emitting diode and then thermally processed at a temperature of 140° C., whereby the silicone resin was hardened to manufacture a white LED lamp.

The bound three-color mixed phosphors were produced in the following manner. First of phosphors are put into water to make a suspension. While this suspension was being stirred, barium-calcium borate $(3(Ba, Ca)O.B_2O_3)$ was added at a ratio of 0.1 mass % to the total amount of the phosphors. The stirring was stopped after continued for 30 minutes to settle the phosphors. After filtrated and baked, they were passed through a 200-mesh nylon sieve, whereby bound three-color mixed phosphors were obtained.

EXAMPLE 2

A Eu-activated alkaline earth chlorophosphate $((Sr_{0.97}Ca_{0.02}Eu_{0.01})_{10}(PO_4)_6.Cl_2)$ phosphor was prepared as the blue phosphor, a Eu and Mn-activated aluminate $((Ba_{0.726}Eu_{0.274})(Mg_{0.50}Mn_{0.50})Al_{10}O_{17})$ phosphor was prepared as the green phosphor, and a Eu-activated lanthanum oxysulfide $((La_{0.884}Sb_{0.001}Eu_{0.115})_2O_2S)$ phosphor was prepared as the red phosphor. These phosphors were bound at a ratio of 18.8%, 19.4% and 61.8% and mixed, at a concentration of 40 mass %, with a silicone resin to make a slurry. This slurry was dropped onto the light-emitting diode and then thermally processed at a temperature of 140° C., whereby the silicone resin was hardened to manufacture a white LED lamp.

The bound three-color mixed phosphors were produced in the following manner. First of all, an acrylic resin emulsion was added to each of the phosphors at a ratio of 0.1 mass % in a solid content to the total amount of each of the phosphors, and the phosphors were mixed together. Then, the mixture of them was dried at 120° C. and then passed through a nylon mesh, whereby bound three-color mixed phosphors were obtained.

EXAMPLE 3

A Eu-activated alkaline earth chlorophosphate $((Sr_{0.99}Eu_{0.01})_{10}(PO_4)_6.Cl_2)$ phosphor was prepared as the blue phosphor, a Eu and Mn-activated aluminate $((Ba_{0.25}Sr_{0.475}Eu_{0.275})(Mg_{0.55}Mn_{0.45})Al_{10}O_{17})$ phosphor was prepared as the green phosphor, and a Eu-activated lanthanum oxysulfide $((La_{0.883}Sb_{0.002}Eu_{0.115})_2O_2S)$ phosphor was prepared as the red phosphor. These phosphors were bound at a ratio of 18.7%, 19.5% and 61.8% and mixed, at a concentration of 40 mass %, with a silicone resin to make a slurry. This slurry was dropped onto the light-emitting diode and then thermally processed at a temperature of 140° C. to manufacture a white LED lamp. The step of binding three-color mixed phosphors was the same as that in Example 1.

EXAMPLE 4

A Eu-activated alkaline earth chlorophosphate $((Sr_{0.75}Ba_{0.23}Ca_{0.01}Eu_{0.01})_{10}(PO_4)_6.Cl_2)$ phosphor was prepared as the blue phosphor, a Eu and Mn-activated aluminate $((Ba_{0.726}Eu_{0.274})(Mg_{0.55}Mn_{0.45})Al_{10}O_{17})$ phosphor was prepared as the green phosphor, and a Eu-activated lanthanum oxysulfide $((La_{0.883}Sn_{0.002}Eu_{0.115})_2O_2S)$ phosphor was prepared as the red phosphor. These phosphors were bound at a ratio of 18.9%, 19.5% and 61.6% and mixed, at a concentration of 40 mass %, with a silicone resin to make a slurry. This slurry was dropped onto the light-emitting diode and then thermally processed at a temperature of 140° C. to manufacture a white LED lamp. The step of binding three-color mixed phosphors was the same as that in Example 1.

EXAMPLE 5

A Eu-activated alkaline earth chlorophosphate $((Sr_{0.98}Eu_{0.02})_{10}(PO_4)_6.Cl_2)$ phosphor was prepared as the blue phosphor, a Eu and Mn-activated aluminate $((Ba_{0.726}Eu_{0.274})(Mg_{0.60}Mn_{0.40})Al_{10}O_{17})$ phosphor was prepared as the green phosphor, and a Eu-activated lanthanum oxysulfide $((La_{0.883}Sb_{0.002}Eu_{0.115})_2O_2S)$ phosphor was prepared as the red phosphor. These phosphors were bound at a ratio of 18.8%, 19.4% and 61.8% and mixed, at a concentration of 40 mass %, with a silicone resin to make a slurry. This slurry was dropped onto the light-emitting diode and then thermally processed at a temperature of 140° C. to manufacture a white LED lamp. The step of binding three-color mixed phosphors was the same as that in Example 1.

EXAMPLE 6

A Eu-activated alkaline earth chlorophosphate $((Sr_{0.97}Ca_{0.02}Eu_{0.01})_{10}(PO_4)_6.Cl_2)$ phosphor was prepared as the blue phosphor, a Eu and Mn-activated aluminate $((Ba_{0.35}Sr_{0.375}Eu_{0.275})$ $(Mg_{0.55}Mn_{0.45})Al_{10}O_{17})$ phosphor was prepared as the green phosphor, and a Eu-activated lanthanum oxysulfide $((La_{0.884}Sb_{0.001}Eu_{0.115})_2O_2S)$ phosphor was prepared as the red phosphor. These phosphors were bound at a ratio of 18.5%, 19.2% and 62.3% and mixed, at a concentration of 40 mass %, with a silicone resin to make a slurry. This slurry was dropped onto the light-emitting diode and then thermally processed at a temperature of 140° C. to manufacture a white LED lamp. The step of binding three-color mixed phosphors was the same as that in Example 1.

EXAMPLE 7

A Eu-activated alkaline earth chlorophosphate $((Sr_{0.99}Eu_{0.01})_{10}(PO_4)_6.Cl_2)$ phosphor was prepared as the blue phosphor, a Eu and Mn-activated aluminate $((Ba_{0.75}Eu_{0.25})$ $(Mg_{0.55}Mn_{0.45})Al_{10}O_{17})$ phosphor was prepared as the green phosphor, and a Eu-activated lanthanum oxysulfide $((La_{0.883}Sb_{0.002}Eu_{0.115})_2O_2S)$ phosphor was prepared as the red phosphor. These phosphors were bound at a ratio of 18.8%, 19.5% and 61.7% and mixed, at a concentration of 40 mass %, with a silicone resin to make a slurry. This slurry was dropped onto the light-emitting diode and then thermally processed at a temperature of 140° C. to manufacture a white LED lamp. The step of binding three-color mixed phosphors was the same as that in Example 1.

EXAMPLE 8

A Eu-activated alkaline earth chlorophosphate $((Sr_{0.99}Eu_{0.01})_{10}(PO_4)_6.Cl_2)$ phosphor was prepared as the blue phosphor, a Eu and Mn-activated aluminate $((Ba_{0.726}Eu_{0.274})(Mg_{0.55}Mn_{0.45})Al_{10}O_{17})$ phosphor was prepared as the green phosphor, and a Eu-activated lanthanum oxysulfide $((La_{0.883}Sb_{0.002}Eu_{0.115})_2O_2S)$ phosphor was prepared as the red phosphor. These phosphors were bound at a ratio of 18.7%, 19.6% and 61.7% and mixed, at a concentration of 30 mass %, with a silicone resin to make a slurry. This slurry was dropped onto the light-emitting diode and then thermally processed at a temperature of 140° C. to manufacture a white LED lamp. The step of binding three-color mixed phosphors was the same as that in Example 1.

EXAMPLE 9

A Eu-activated alkaline earth chlorophosphate $((Sr_{0.97}Eu_{0.03})_{10}(PO_4)_6.Cl_2)$ phosphor was prepared as the blue phosphor, a Eu and Mn-activated aluminate $((Ba_{0.75}Eu_{0.25})$ $(Mg_{0.55}Mn_{0.45})Al_{10}O_{17})$ phosphor was prepared as the green phosphor, and a Eu-activated lanthanum oxysulfide $((La_{0.883}Sb_{0.002}Eu_{0.115})_2O_2S)$ phosphor was prepared as the red phosphor. These phosphors were bound at a ratio of 18.9%, 19.5% and 61.6% and mixed, at a concentration of 40 mass %, with a silicone resin to make a slurry. This slurry was dropped onto the light-emitting diode and then thermally processed at a temperature of 140° C. to manufacture a white LED lamp. The step of binding three-color mixed phosphors was the same as that in Example 1.

EXAMPLE 10

A Eu-activated alkaline earth chlorophosphate $((Sr_{0.99}Eu_{0.01})_{10}(PO_4)_6.Cl_2)$ phosphor was prepared as the blue phosphor, a Eu and Mn-activated aluminate $((Ba_{0.726}Eu_{0.274})(Mg_{0.55}Mn_{0.45})Al_{10}O_{17})$ phosphor was prepared as the green phosphor, and a Eu-activated lanthanum oxysulfide $((La_{0.882}Sb_{0.003}Eu_{0.115})_2O_2S)$ phosphor was prepared as the red phosphor. These phosphors were bound at a ratio of 18.8%, 19.4% and 61.8% and mixed, at a concentration of 30 mass %, with a silicone resin to make a slurry. This slurry was dropped onto the light-emitting diode and then thermally processed at a temperature of 140° C. to manufacture a white LED lamp. The step of binding three-color mixed phosphors was the same as that in Example 1.

COMPARATIVE EXAMPLE 1

A Eu-activated alkaline earth chlorophosphate $((Sr_{0.59}Ba_{0.39}Ca_{0.01}Eu_{0.01})_{10}(PO_4)_6.Cl_2)$ phosphor was prepared as the blue phosphor, a Cu and Al-activated zinc sulfide (ZnS: Cu, Al) phosphor was prepared as the green phosphor, and a Eu-activated yttrium oxysulfide $((Y_{0.94}Eu_{0.06})_2O_2S)$ phosphor was prepared as the red phosphor. These phosphors were separately mixed, at a concentration of 30 mass %, with a silicone resin to make slurries. These slurries were then mixed together at a ratio of 18.8%, 19.4% and 61.8%, and the mixed slurries were then dropped onto the light-emitting diode and then thermally processed at a temperature of 140° C. to manufacture a white LED lamp. Note that the step of binding the phosphors was not carried out in Comparative Example 1.

COMPARATIVE EXAMPLE 2

A Eu-activated alkaline earth chlorophosphate $((Sr_{0.59}Ba_{0.39}Ca_{0.01}Eu_{0.01})_{10}(PO_4)_6.Cl_2)$ phosphor was prepared as the blue phosphor, a Eu and Mn-activated aluminate $((Ba_{0.864}Eu_{0.136})(Mg_{0.74}Mn_{0.26})Al_{10}O_{17})$ phosphor was prepared as the green phosphor, and a Eu-activated yttrium oxysulfide $((Y_{0.94}Eu_{0.06})_2O_2S)$ phosphor was prepared as the red phosphor. These phosphors were separately mixed, at a concentration of 30 mass %, with a silicone resin to make slurries. These slurries were then mixed together at a ratio of 18.7%, 19.5% and 61.8%, and the mixed slurries were then dropped onto the light-emitting diode and then thermally processed at a temperature of 140° C. to manufacture a white LED lamp. Note that the step of binding the phosphors was not carried out in Comparative Example 2.

Next, a current of 40 mA was flowed to each of the white LED lamps according to Examples 1 to 10 and Comparative Examples 1 and 2 and the liquid crystal displays using them as backlights to thereby light them, and the color reproduction range and the brightness of emission of them in that event were measured. The measurement results are shown in Table 1. Note that the color reproduction range and the brightness of a liquid crystal display using a cold cathode fluorescent lamp as a backlight are also shown in Table 1 as Conventional Example (Comparative Example 3).

Measurement of the emission spectrum of each of the white LED lamps showed that all of the white LED lamps according to Examples 1 to 10 had peaks in a blue region of not less than 440 nm nor more than 460 nm, a green region of not less than 510 nm nor more than 530 nm, and a red region of not less than 620 nm nor more than 640 nm, and a half width of each emission peaks of 50 nm or less. On the other hand, the wavelength peaks in a green region and a red region were out of the above-described ranges in the white LED lamp of Comparative Example 1, and only the wavelength peak in a red region was out of the above-described range in the white LED lamp of Comparative Example 2.

TABLE 1

|  | Color Reproduction Region | Brightness (cd) |
| --- | --- | --- |
| Example 1 | 98 | 400 |
| Example 2 | 96 | 400 |
| Example 3 | 95 | 410 |
| Example 4 | 93 | 430 |
| Example 5 | 96 | 410 |
| Example 6 | 95 | 420 |
| Example 7 | 97 | 405 |
| Example 8 | 98 | 390 |
| Example 9 | 97 | 410 |
| Example 10 | 96 | 400 |
| Comparative Example 1 | 80 | 400 |
| Comparative Example 2 | 87 | 300 |
| Comparative Example 3 (Conventional Example) | 65 | — |

As is clear from Table 1, the white LED lamps according to Examples 1 to 10 and the liquid crystal display devices using them as backlights exhibit excellent properties such as a color reproducibility of 90 or more and a brightness of 390 mcd or more.

EXAMPLES 11 to 14

White LED lamp were manufactured in the same manner as that of Example 1 other than that the emission wavelengths of the light-emitting diodes were changed to those shown in Table 2, and subjected to similar measurement. It should be noted that the mixture ratio of the blue, green and red phosphors was adjusted so that the chromaticities of the LED lamps fell within ranges x=0.250 to 0.255, y=0.235 to 0.240.

TABLE 2

|  | Emission Wavelength of Light-emitting Diode (nm) | Color Reproduction Region | Brightness (mcd) |
| --- | --- | --- | --- |
| Example 1 | 399 | 98 | 400 |
| Example 11 | 360 | 98 | 300 |
| Example 12 | 370 | 98 | 460 |
| Example 13 | 410 | 98 | 380 |
| Example 14 | 420 | 95 | 100 |

As is clear from Table 2, use of a light-emitting diode having an emission wavelength of not less than 370 nm nor more than 410 nm can realize a white LED lamp excellent in brightness and color reproducibility.

Next, variations in chromaticity of the white LED lamps according to Examples 1 to 10 were measured. As for the chromaticity, 20 white LED lamps according to each of Examples were prepared and the chromaticity (CIE chromaticity coordinate) was measured directly above each of the LED lamps, and differences between a maximum value and a minimum value of an x coordinate and a y coordinate (Δx, Δy) were evaluated. Note that as Reference Example, a white LED lamp similar to that in Example 1 was manufactured other than that the phosphor binding step was not performed, and subjected to similar measurement. The results are shown in Table 3.

TABLE 3

|  | Δx | Δy |
| --- | --- | --- |
| Example 1 | 0.02 | 0.02 |
| Example 2 | 0.01 | 0.02 |
| Example 3 | 0.03 | 0.02 |
| Example 4 | 0.01 | 0.02 |
| Example 5 | 0.02 | 0.02 |
| Example 6 | 0.02 | 0.03 |
| Example 7 | 0.02 | 0.01 |
| Example 8 | 0.03 | 0.02 |
| Example 9 | 0.01 | 0.02 |
| Example 10 | 0.02 | 0.02 |
| Reference Example | 0.05 | 0.06 |

As is clear from Table 3, the white LED lamps according to Examples have smaller variations in chromaticity. Such white LED lamps can be effectively used as components in various kinds of display devices such as mobile communication equipment, PC peripheral equipment, OA equipment, household electric equipment, various switches, backlight-type display plate and so on. In particular, because of small variation in chromaticity, a surface light source having uniform white color can be obtained also in a case in which a plurality of white LED lamps are used in a backlight. Accordingly, the property of the liquid crystal display device using them is also improved.

EXAMPLE 15

The blue, green and red phosphors having the same composition as that in Example 2 were bound in the same manner as that in Example 2 to produce bound phosphors. However, the phosphors different in particle size were used. Table 4 shows the mixture ratio of phosphors and the average particle size of bound phosphors. The bound phosphors were used to manufacture white LED lamps in the same manner as that in Example 2, and brightness measurement was similarly performed. Table 4 shows the brightness of the white LED lamps.

TABLE 4

| Sample No. | Mixture Ratio (mass %) | | | Bound Phosphor Average Particle Size (μm) | White LED Lamp Brightness (mcd) |
| --- | --- | --- | --- | --- | --- |
| | Blue Phosphor | Green Phosphor | Red Phosphor | | |
| 1 | 18.8 | 19.4 | 61.8 | 5.0 | 350 |
| 2 | 18.1 | 19.3 | 62.6 | 8.9 | 380 |
| 3 | 18.6 | 19.0 | 62.4 | 11.9 | 400 |
| 4 | 18.3 | 19.1 | 62.6 | 16.1 | 410 |
| 5 | 19.0 | 19.1 | 61.9 | 25.9 | 415 |
| 6 | 19.1 | 19.5 | 61.4 | 36.2 | 423 |
| 7 | 18.9 | 19.6 | 61.5 | 49.3 | 420 |
| 8 | 19.0 | 19.0 | 62.0 | 64.7 | 415 |
| 9 | 18.8 | 19.4 | 61.8 | 75.6 | 410 |
| 10 | 18.7 | 19.6 | 61.7 | 83.9 | 395 |
| 11 | 18.8 | 19.7 | 61.5 | 92.6 | 360 |

Note that the mixture ratio of the blue, green and red phosphors constituting the bound phosphors for use in the white LED lamp are such that each of the blue and green phosphors is within 10% to 30% and the red phosphor is within 50% to 80% as shown in Examples 1 to 15.

INDUSTRIAL APPLICABILITY

A white light-emitting device of the present invention has high brightness and excellent color reproducibility as well as small variation in emission chromaticity. Such a white light-emitting device is effective to backlight application. A backlight using the white light-emitting device of the present invention and a liquid crystal display device to which such a backlight is applied can enhance the brightness and color reproducibility and reduce the variation in emission chromaticity. Accordingly, a high-quality liquid crystal display device can be provided.

What is claimed is:

1. A white light-emitting device, comprising:
a semiconductor light-emitting element emitting ultraviolet light or violet light; and
a light-emitting unit, which is excited by the light from the semiconductor light-emitting element to emit white light, including three or more kinds of visible light-emitting phosphors, including a blue light-emitting phosphor, a green light-emitting phosphor, and a red light-emitting phosphor,
wherein emission spectrum of the light-emitting unit has peaks in a blue region of not less than 440 nm nor more than 460 nm, a green region of not less than 510 nm nor more than 530 nm, and a red region of not less than 620 nm nor more than 640 nm, and the three or more kinds of visible light-emitting phosphors are bound together with a binder in advance,
wherein the blue light-emitting phosphor comprises a europium-activated halo-phosphate phosphor having a composition which is represented by the general formula:

$$(Sr_{1-x-y}Ba_xCa_yEu_z)_{10}(PO_4)_6Cl_2$$

(where, x, y and z are numbers satisfying x<0.2, y<0.1, 0.005<z<0.1),
wherein the green light-emitting phosphor comprises a europium and manganese-activated aluminate phosphor having a composition which is represented by the general formula:

$$(Ba_{1-x-y-z}Sr_xCa_yEu_z)(Mg_{1-u}Mn_u)Al_{10}O_{17}$$

(where, x, y and z are numbers satisfying x<0.5, y<0.1, 0.15<z<0.4, 0.3<u<0.6),
wherein the red light-emitting phosphor comprises a europium-activated lanthanum oxysulfide phosphor having a composition which is represented by the general formula:

$$(La_{1-x-y}Eu_xM_y)_2O_2S$$

(where, M shows at least one of element selected from Sb and Sn, and x and y are numbers satisfying 0.01<x<0.15, y<0.03),
wherein the visible light-emitting phosphors include 10 mass % to 30 mass % of the blue light-emitting phosphor, 10 mass % to 30 mass % of the green light-emitting phosphor, and 50 mass % to 80 mass % of the red light-emitting phosphor.

2. The white light-emitting device as set forth in claim 1, wherein a half width of each of the peaks in the blue region, the green region and the red region is 50 nm or less.

3. The white light-emitting device as set forth in claim 1, wherein the semiconductor light-emitting element has a peak value of an emission wavelength of not less than 370 nm nor more than 410 nm.

4. The white light-emitting device as set forth in claim 1, wherein the semiconductor light-emitting element includes a light-emitting diode or a laser diode.

5. The white light-emitting device as set forth in claim 1, wherein the light-emitting unit has a resin layer in which the bound three or more kinds of visible light-emitting phosphors are dispersed.

6. The white light-emitting device as set forth in claim 1, wherein both an average primary particle size before bonding and an average secondary particle size after bonding of the three or more kinds of visible light-emitting phosphors are 7 μm or more.

7. A method of manufacturing a white light-emitting device, comprising:
preparing three or more kinds of visible light-emitting phosphors including a blue light-emitting phosphor, a green light-emitting phosphor, and a red light-emitting phosphor, adjusted to have emission spectrum of white light emission exhibiting peaks in a blue region of not less than 440 nm nor more than 460 nm, a green region of not less than 510 nm nor more than 530 nm, and a red region of not less than 620 nm nor more than 640 nm;
binding the three or more kinds of visible light-emitting phosphors with a binder; and
forming a light-emitting unit including the bound three or more kinds of visible light-emitting phosphors, in a light-emitting direction of a semiconductor light-emitting element emitting ultraviolet light or violet light,
wherein the blue light-emitting phosphor comprises a europium-activated halo-phosphate phosphor having a composition which is represented by the general formula:

$$(Sr_{1-x-y}Ba_xCa_yEu_z)_{10}(PO_4)_6Cl_2$$

(where, x, y and z are numbers satisfying x<0.2, y<0.1, 0.005<z<0.1),
wherein the green light-emitting phosphor comprises a europium and manganese-activated aluminate phosphor having a composition which is represented by the general formula:

$$(Ba_{1-x-y-z}Sr_xCa_yEu_z)(Mg_{1-u}Mn_u)Al_{10}O_{17}$$

(where, x, y and z are numbers satisfying x<0.5, y<0.1, 0.15<z<0.4, 0.3<u<0.6),
wherein the red light-emitting phosphor comprises a europium-activated lanthanum oxysulfide phosphor having a composition which is represented by the general formula:

$$(La_{1-x-y}Eu_xM_y)_2O_2S$$

(where, M shows at least one of element selected from Sb and Sn, and x and y are numbers satisfying 0.01<x<0.15, y<0.03),
wherein the visible light-emitting phosphors include 10 mass % to 30 mass % of the blue light-emitting phosphor, 10 mass % to 30 mass % of the green light-emitting phosphor, and 50 mass % to 80 mass % of the red light-emitting phosphor.

8. The method of manufacturing a white light-emitting device as set forth in claim 7, wherein a half width of each of the peaks in the blue region, the green region and the red region is 50 nm or less.

9. The method of manufacturing a white light-emitting device as set forth in claim 7, wherein the bound three or more kinds of visible light-emitting phosphors are dispersed in a resin to form the light-emitting unit.

10. A backlight, comprising:
a substrate; and
a white light-emitting device as set forth in claim 1 mounted on the substrate.

11. The backlight as set forth in claim 10, further comprising:
a plurality of the white light-emitting devices arranged in line or in matrix on the substrate.

12. A liquid crystal display device comprising:
a backlight as set forth in claim 10; and
a liquid crystal display unit disposed on a light-emitting surface side of the backlight.

13. The liquid crystal display device as set forth in claim 12,
wherein the backlight comprises a plurality of the white light-emitting devices arranged in matrix and is disposed directly below the liquid crystal display unit.

14. The liquid crystal display device as set forth in claim 12,
wherein the liquid crystal display unit is disposed on an optical waveguide, and the backlight comprises a plurality of the white light-emitting devices arranged in line and is disposed on one end portion of the optical waveguide.

15. A white light-emitting device, comprising:
a semiconductor light-emitting element emitting ultraviolet light or violet light; and
a light-emitting unit, which is excited by the light from the semiconductor light-emitting element to emit white light, including three or more kinds of visible light-emitting phosphors,
wherein emission spectrum of the light-emitting unit has peaks in a blue region of not less than 440 nm nor more than 460 nm, a green region of not less than 510 nm nor more than 530 nm, and a red region of not less than 620 nm nor more than 640 nm, and the three or more kinds of visible light-emitting phosphors are bound together with a binder in advance,
wherein both an average primary particle size before bonding and an average secondary particle size after bonding of the three or more kinds of visible light-emitting phosphors are 7 μm or more.

* * * * *